United States Patent
Ilango et al.

(10) Patent No.: US 12,163,986 B2
(45) Date of Patent: Dec. 10, 2024

(54) COMPENSATING FOR CURRENT SPLITTING ERRORS IN A MEASUREMENT SYSTEM

(71) Applicant: Cirrus Logic International Semiconductor Ltd., Edinburgh (GB)

(72) Inventors: Anand Ilango, Austin, TX (US); Siddharth Maru, Austin, TX (US); Tejasvi Das, Austin, TX (US); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 188 days.

(21) Appl. No.: 17/846,832

(22) Filed: Jun. 22, 2022

(65) Prior Publication Data

US 2023/0144960 A1 May 11, 2023

Related U.S. Application Data

(60) Provisional application No. 63/277,322, filed on Nov. 9, 2021.

(51) Int. Cl.
*G01R 27/16* (2006.01)
*H03F 3/04* (2006.01)

(52) U.S. Cl.
CPC ............ *G01R 27/16* (2013.01); *H03F 3/04* (2013.01)

(58) Field of Classification Search
CPC .................. G01R 27/16; G01R 31/2829; G01R 19/0092; G01R 19/0023; G01R 27/2611; G01R 31/3183; H03F 3/04; H03F 2200/129; H03F 2203/45528; H03F 3/2173; H03F 2200/351; H03F 3/187; H04R 29/001; H04R 29/003

USPC .......................................................... 324/650
See application file for complete search history.

(56) References Cited

U.S. PATENT DOCUMENTS

| | | | |
|---|---|---|---|
| 10,726,683 B1 * | 7/2020 | Marchais | G08B 3/10 |
| 2020/0309611 A1 * | 10/2020 | Marchais | G06F 3/016 |
| 2020/0313529 A1 * | 10/2020 | Lindemann | H03F 1/0211 |
| 2020/0313654 A1 * | 10/2020 | Marchais | H03H 7/12 |
| 2020/0314969 A1 * | 10/2020 | Marchais | H02M 7/48 |
| 2020/0348249 A1 * | 11/2020 | Marchais | G01R 27/16 |
| 2020/0403546 A1 * | 12/2020 | Janko | G08B 6/00 |
| 2021/0166869 A1 * | 6/2021 | Aljadeff | G01R 35/04 |
| 2021/0174777 A1 * | 6/2021 | Marchais | G10K 9/13 |
| 2021/0344310 A1 * | 11/2021 | Zanbaghi | H03F 3/2173 |
| 2022/0029505 A1 | 1/2022 | Khenkin et al. | |

FOREIGN PATENT DOCUMENTS

CN 205581671 U * 9/2016

OTHER PUBLICATIONS

Combined Search and Examination Report under Sections 17 and 18(3), UKIPO, Application No. GB2215087.4, mailed Apr. 13, 2023.

* cited by examiner

*Primary Examiner* — Tung X Nguyen
*Assistant Examiner* — Robert P Alejnikov
(74) *Attorney, Agent, or Firm* — Jackson Walker L.L.P.

(57) ABSTRACT

A system may include amplifier circuitry configured to drive an electromagnetic load with a driving signal and a processing system communicatively coupled to the electromagnetic load and configured to compensate for current-sensing error of the processing system caused by feedback circuitry of the amplifier circuitry.

16 Claims, 5 Drawing Sheets

COMPENSATING FOR CURRENT SPLITTING ERRORS IN A MEASUREMENT SYSTEM

RELATED APPLICATION

The present disclosure claims priority to United States Provisional Patent Application Ser. No. 63/277,322, filed Nov. 9, 2021, which is incorporated by reference herein in its entirety.

FIELD OF DISCLOSURE

The present disclosure relates in general to methods, apparatuses, or implementations for haptic devices and other electromagnetic actuators. Embodiments set forth herein may disclose improvements relating to how a physical quantity, such as an impedance or displacement, of a haptic actuator or other electromechanical load may be sensed.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin and may play increasing roles in human-machine interactions for modern devices.

An LRA may be modelled as a mass-spring electro-mechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a vibrational actuator (e.g., haptic transducer) 103 based on the signal. Controller 101 may be triggered by a trigger to output to the signal. The trigger may, for example, comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2\pi\sqrt{CM}}$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping the device, the vibration resonance of the haptic transducer may vary from time to time.

FIG. 2 illustrates an example of a linear resonant actuator (LRA) modelled as a linear system. LRAs are non-linear components that may behave differently depending on, for example, the voltage levels applied, the operating temperature, and the frequency of operation. However, these components may be modelled as linear components within certain conditions. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

A haptic system may require precise control of movements of the haptic transducer. Such control may rely on the magnetic force factor Bl, which may also be known as the electromagnetic transfer function of the haptic transducer. In an ideal case, magnetic force factor Bl can be given by the product B·l, where B is magnetic flux density and l is a total length of electrical conductor within a magnetic field. Both magnetic flux density B and length l should remain constant in an ideal case with motion occurring along a single axis.

In generating haptic vibration, an LRA may undergo displacement. In order to protect an LRA from damage, such displacement may be limited. Accordingly, accurate measurement of displacement may be crucial in optimizing LRA displacement protection algorithms Accurate measurement of displacement may also enable increased drive levels of the LRA. While existing approaches measure displacement, such approaches have disadvantages. For example, displacement may be measured using a Hall sensor, but Hall sensors are often costly to implement.

SUMMARY

In accordance with the teachings of the present disclosure, the disadvantages and problems associated with existing approaches for estimating an impedance of and sensing displacement of an electromagnetic transducer may be reduced or eliminated.

In accordance with embodiments of the present disclosure, a system may include amplifier circuitry configured to drive an electromagnetic load with a driving signal and a processing system communicatively coupled to the electromagnetic load and configured to compensate for current-sensing error of the processing system caused by feedback circuitry of the amplifier circuitry.

In accordance with these and other embodiments of the present disclosure, a method may include driving, with amplifier circuitry, an electromagnetic load with a driving signal and compensating for current-sensing error of a processing system communicatively coupled to the electromagnetic load, wherein the current-sensing error is caused by feedback circuitry of the amplifier circuitry.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
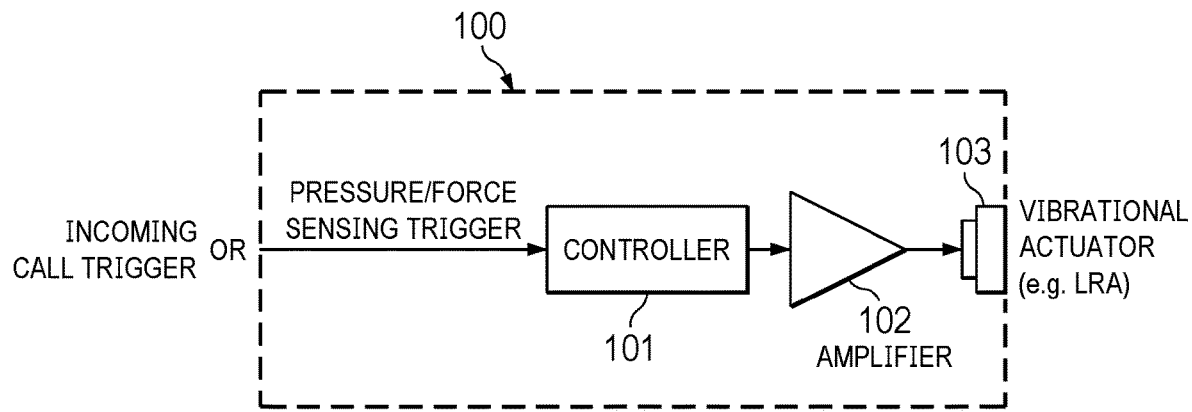
FIG. 1 illustrates an example of a vibro-haptic system in a device, as is known in the art.
Figure 2:
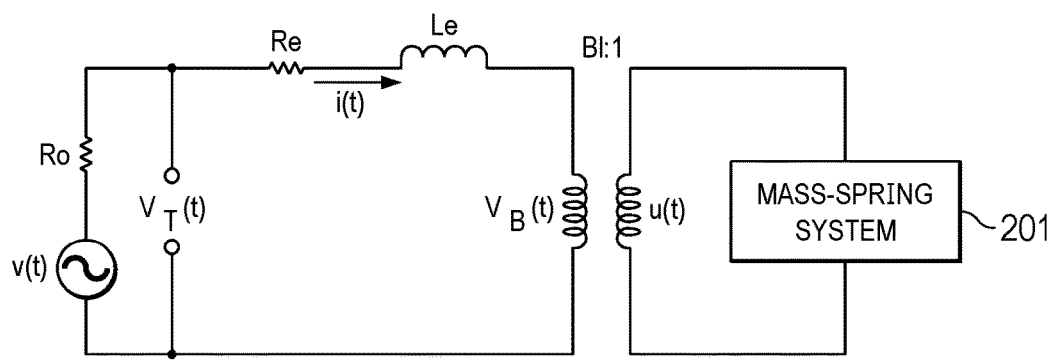
FIG. 2 illustrates an example of a Linear Resonant Actuator (LRA) modelled as a linear system, as is known in the art.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection-type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal may generally be an analog time varying voltage signal, for example, a time varying waveform.

To accurately sense displacement of an electromagnetic load, methods and systems of the present disclosure may determine an inductance of the electromagnetic load, and then convert the inductance to a position signal, as described in greater detail below. Further, to measure inductance of an electromagnetic load, methods and systems of the present disclosure may utilize either a phase measurement approach and/or a high-frequency pilot-tone driven approach, as also described in greater detail below.

To illustrate, an electromagnetic load may be driven by a driving signal V(t) to generate a sensed terminal voltage $V_T(t)$ across a coil of the electromagnetic load. Sensed terminal voltage $V_T(t)$ may be given by:

$$V_T(t) = Z_{COIL} I(t) + V_B(t)$$

wherein I(t) is a sensed current through the electromagnetic load, $Z_{COIL}$ is an impedance of the electromagnetic load, and $V_B(t)$ is the back-electromotive force (back-EMF) associated with the electromagnetic load.

As used herein, to "drive" an electromagnetic load means to generate and communicate a driving signal to the electromagnetic load to cause displacement of a movable mass of the electromagnetic load.

Because back-EMF voltage $V_B(t)$ may be proportional to velocity of the moving mass of the electromagnetic load, back-EMF voltage $V_B(t)$ may in turn provide an estimate of such velocity. Thus, velocity of the moving mass may be recovered from sensed terminal voltage $V_T(t)$ and sensed current I(t) provided that either: (a) sensed current I(t) is equal to zero, in which case $V_B(t) = V_T(t)$; or (b) coil impedance $Z_{COIL}$ is known or is accurately estimated.

Position of the moving mass may be related to a coil inductance $L_{COIL}$ of the electromagnetic load. At high frequencies significantly above the bandwidth of the electromagnetic load, back-EMF voltage $V_B(t)$ may become negligible and inductance may dominate the coil impedance $Z_{COIL}$. Sensed terminal voltage $V_{T@HF}(t)$ at high frequencies may be estimated by:

$$V_{T@HF}(t) = Z_{COIL} I_{@HF}(t)$$

Hence, at high frequencies, the position of the moving mass of the electromagnetic load may be recovered from sensed terminal voltage $V_T(t)$ and sensed current I(t) by: (a) estimating the coil impedance at high frequency as $Z_{COIL@HF} \cong R_{@HF} L_{@HF} \cdot s$, where $R_{@HF}$ is the resistive part of the coil impedance at high frequency, $L_{@HF}$ is the coil inductance at high frequency, and s is the Laplace transform; and (b) converting the measured inductance to a position signal. Velocity and/or position may be used to control vibration of the moving mass of the electromagnetic load.

Figure 3:
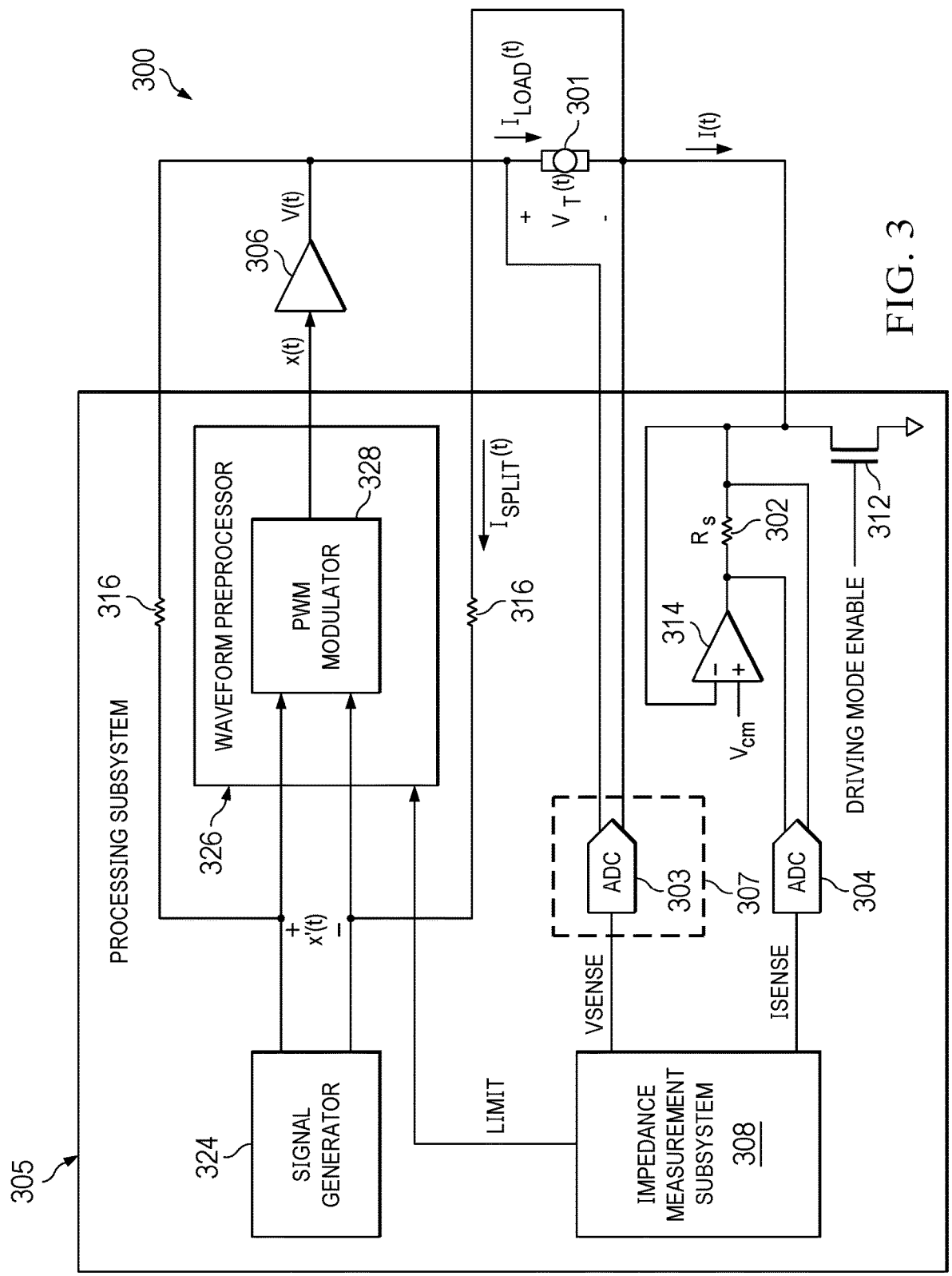
FIG. 3 illustrates selected components of an example host device, in accordance with embodiments of the present disclosure.

FIG. 3 illustrates selected components of an example host device 300 having an electromagnetic load 301, in accordance with embodiments of the present disclosure. Host device 300 may include, without limitation, a mobile device, home application, vehicle, and/or any other system, device, or apparatus that includes a human-machine interface. Electromagnetic load 301 may include any suitable load with a complex impedance, including without limitation a haptic transducer, a loudspeaker, a microspeaker, a piezoelectric transducer, a voice-coil actuator, a solenoid, or other suitable transducer.

In operation, a signal generator 324 of a processing subsystem 305 of host device 300 may generate a raw transducer driving signal x'(t) (which, in some embodiments, may be a waveform signal, such as a haptic waveform signal or audio signal). Raw transducer driving signal x'(t) may be generated based on a desired playback waveform received by signal generator 324. In some embodiments, raw transducer driving signal x'(t) may comprise a differential pulse-width modulation (PWM) signal.

Raw transducer driving signal x'(t) may be received by waveform preprocessor 326 which, as described in greater detail below, may modify or otherwise convert raw transducer driving signal x'(t) in order to generate processed transducer driving signal x(t). For example, waveform preprocessor 326 may include a PWM modulator 328. PWM modulator 328 may include any suitable device, system, or apparatus configured to generate a single-ended PWM signal from raw transducer driving signal x'(t). For example, PWM modulator 328 may include a delta-sigma modulator comprising one or more integrator stages, a quantizer, and a conversion block configured to convert a differential signal into a single-ended signal. Accordingly, processed transducer driving signal x(t) may comprise a single-ended signal (e.g., a single-ended PWM signal) communicated to amplifier 306. Processed transducer driving signal x(t) may in turn be amplified by amplifier 306 to generate a driving signal V(t) for driving electromagnetic load 301. Amplifier 306 may comprise a single-ended Class-D output stage (e.g., one half of an H-bridge).

In operation, to estimate impedance $Z_{COIL}$, impedance measurement subsystem 308 may measure impedance in any suitable manner, including without limitation using the approaches set forth in U.S. patent applicaton Ser. No. 17/497,110 filed Oct. 8, 2021, which is incorporated in its entirety by reference herein. For example, processing subsystem 305 may drive a pilot signal to electromagnetic transducer 301, and a complex impedance $Z_{COIL}$ of electromagnetic load 301 may be estimated by measuring the amplitudes of and relative phases between a sensed terminal voltage $V_T(t)$ of electromagnetic load 301 and current I(t) flowing through electromagnetic load 301 that result from driving of the pilot signal $$\left(e.g., Z_{COIL} = \frac{V_T(t)}{I(t)}\right).$$

From the determination of complex impedance, coil inductance at high frequency $L_{@HF}$ may be estimated, from which a displacement of electromagnetic load 301 may also be estimated.

Accordingly, responsive to driving signal V(t), a sensed terminal voltage $V_T(t)$ of electromagnetic load 301 may be sensed by a terminal voltage sensing block 307 of processing subsystem 305, for example a volt-meter, and converted to a digital representation VSENSE by a first analog-to-digital converter (ADC) 303. As shown in FIG. 3, feedback resistors 316 may be coupled to respective terminals of electromagnetic load 301 and respective input terminals of PWM modulator 328 to provide closed-loop feedback to the generation of processed transducer driving signal x(t).

Similarly, sensed current I(t) may be converted to a digital representation ISENSE by a second ADC 304. Current 1(t) may be sensed across a shunt resistor 302 having resistance $R_s$ coupled to a terminal of electromagnetic load 301. As shown in FIG. 3, ADC 304 and shunt resistor 302 may be part of a current-sensing circuit including a ground-return transistor 312 and a common-mode buffer 314. Ground-return transistor 312 and common-mode buffer 314 may operate in at least two modes: a load sensing mode and a driving mode. During the driving mode (e.g., a normal playback mode or haptics mode), waveform preprocessor 326 may drive a haptic waveform as processed transducer driving signal x(t), ground return transistor 312 may be enabled (e.g., on, closed, activated), and common-mode buffer 314 may be disabled (e.g., off, deactivated), thus coupling a terminal of electromagnetic load 301 to ground. On the other hand, during the load sensing mode, ground return transistor 312 may be disabled and common-mode buffer 314 may be enabled, thus coupling the same terminal of electromagnetic load 301 to a common-mode voltage $V_{CM}$. In the load sensing mode, waveform preprocessor 326 may drive a pilot tone or other signal suitable for measuring driving signal V(t) and sensed current I(t) in order to determine an impedance (e.g., resistance and inductance) of electromagnetic load 301, wherein a component of such impedance (e.g., inductance) may be representative of a displacement of electromagnetic load 301.

As shown in FIG. 3, processing subsystem 305 may include an impedance measurement subsystem 308 that may estimate coil inductance $L_{COIL}$ of electromagnetic load 301. From such estimated coil inductance $L_{COIL}$, impedance measurement subsystem 308 may determine a displacement associated with electromagnetic load 301. If such displacement exceeds a threshold, high-frequency pilot-tone driven impedance measurement subsystem 308 may communicate a limiting signal (indicated by "LIMIT" in FIG. 3) to modify raw transducer driving signal x'(t) in a manner that prevents over-excursion in the displacement of electromagnetic load 301.

One disadvantage of the architecture depicted in FIG. 3 stems from the fact that a portion of the current $I_{LOAD}(t)$ through electromagnetic load 301 may be split between a feedback resistor 316 having split current $I_{SPLIT}(t)$ and shunt resistor 302 having sensed current I(t), such that sensed current I(t) measured by shunt resistor 302 has a measurement error. Such split current $I_{SPLIT}(t)$ may be given approximately as:

$$I_{SPLIT}(t) = \frac{V_T(t)}{2G_{PWM}(R_f + R_i)} \quad (1)$$

wherein $G_{PWM}$ is a gain of PWM modulator 328, $R_f$ is the resistance of each of feedback resistors 316, and $R_i$ is an input resistance present at each input terminal of PWM modulator between PWM modulator 328 and signal generator 324, such input resistance not explicitly depicted in FIG. 3.

A magnitude of such split current $I_{SPLIT}(t)$ may be minimized by increasing a resistance of feedback resistor 316. However, such an increase in resistance may increase measurement noise potentially requiring longer measurement times and additional filtering. Thus, a signal-dependent offset correction may be desirable. Examples of such signal-dependent offset corrections are described below in reference to FIGS. 4A-6.

Figure 4A:
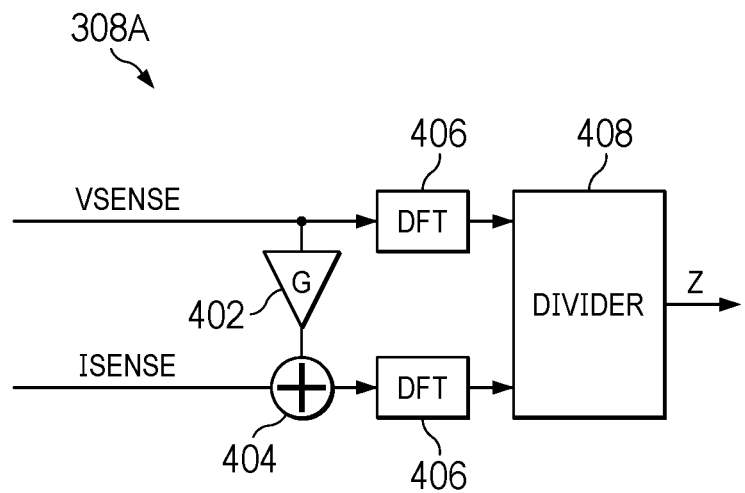
FIG. 4A illustrates selected components of an example impedance measurement subsystem, in accordance with embodiments of the present disclosure.

FIG. 4A illustrates selected components of an example impedance measurement subsystem 308A, in accordance with embodiments of the present disclosure. In some embodiments, example impedance measurement subsystem 308A may be used to implement all or a portion of impedance measurement subsystem 308 depicted in FIG. 3. As described in greater detail below, example impedance measurement subsystem 308A may perform signal-dependent sample rate correction to compensate for split current $I_{SPLIT}$(t).

As shown in FIG. 4A, a gain G may be applied to digital sensed voltage VSENSE by gain element 402 to generate a compensation signal equivalent to split current $I_{SPLIT}$(t) which may be added to digital sensed current ISENSE by a combiner 404 to generate a compensated digital sensed current ISENSE'. In accordance with equation (1) above, such gain G may be equal to:

$$G = \frac{VSENSE}{2G_{PWM}(R_f + R_i)}$$

The values of PWM modulator gain $G_{PWM}$, feedback resistance $R_f$, and input resistance $R_i$ may be estimated a priori.

Discrete Fourier transforms (DFTs) 406, or other suitable mathematical transforms, may be applied to each of digital sensed voltage VSENSE and the compensated digital sensed current ISENSE' to transform such signals from the time domain to the frequency domain. A divider block 408 may perform a complex mathematical division of the frequency-domain equivalent signals in order to estimate coil impedance $Z_{COIL}$.

Figure 4B:
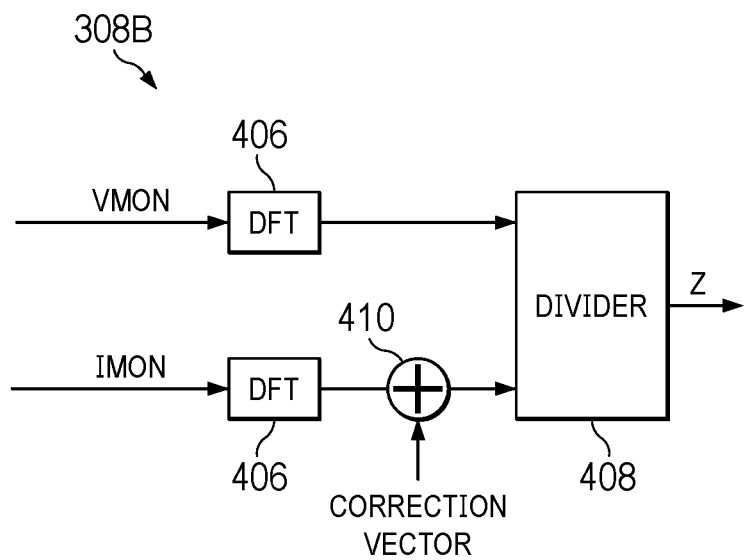
FIG. 4B illustrates selected components of another example impedance measurement subsystem, in accordance with embodiments of the present disclosure.

FIG. 4B illustrates selected components of an example impedance measurement subsystem 308B, in accordance with embodiments of the present disclosure. In some embodiments, example impedance measurement subsystem 308B may be used to implement all or a portion of impedance measurement subsystem 308 depicted in FIG. 3. As described in greater detail below, example impedance measurement subsystem 308B may perform vector compensation to compensate for split current $I_{SPLIT}$(t).

Impedance measurement subsystem 308B may be similar in many respects to impedance measurement subsystem 308A, except that compensation in impedance measurement subsystem 308B is applied after conversion of digital sensed voltage VSENSE and digital sensed current ISENSE into the frequency domain. Accordingly, discrete Fourier transforms (DFTs) 406, or other suitable mathematical transforms, may be applied to each of digital sensed voltage VSENSE and the digital sensed current ISENSE to transform such signals from the time domain to the frequency domain.

A combiner 410 may add a frequency-domain correction vector to the frequency-domain equivalent sensed current to generate a compensated frequency-domain sensed current. Such correction vector may be estimated based on digital sensed voltage VSENSE.

A divider block 408 may perform a complex mathematical division of the frequency-domain equivalent signals in order to estimate coil impedance $Z_{COIL}$.

In addition to or in lieu of compensation being performed digitally by impedance measurement system 308, as shown in FIGS. 4A and 4B, in some embodiments, processing subsystem 305 may include circuitry in addition to that shown in FIG. 3 in order to perform compensation in the analog domain.

Figure 5:
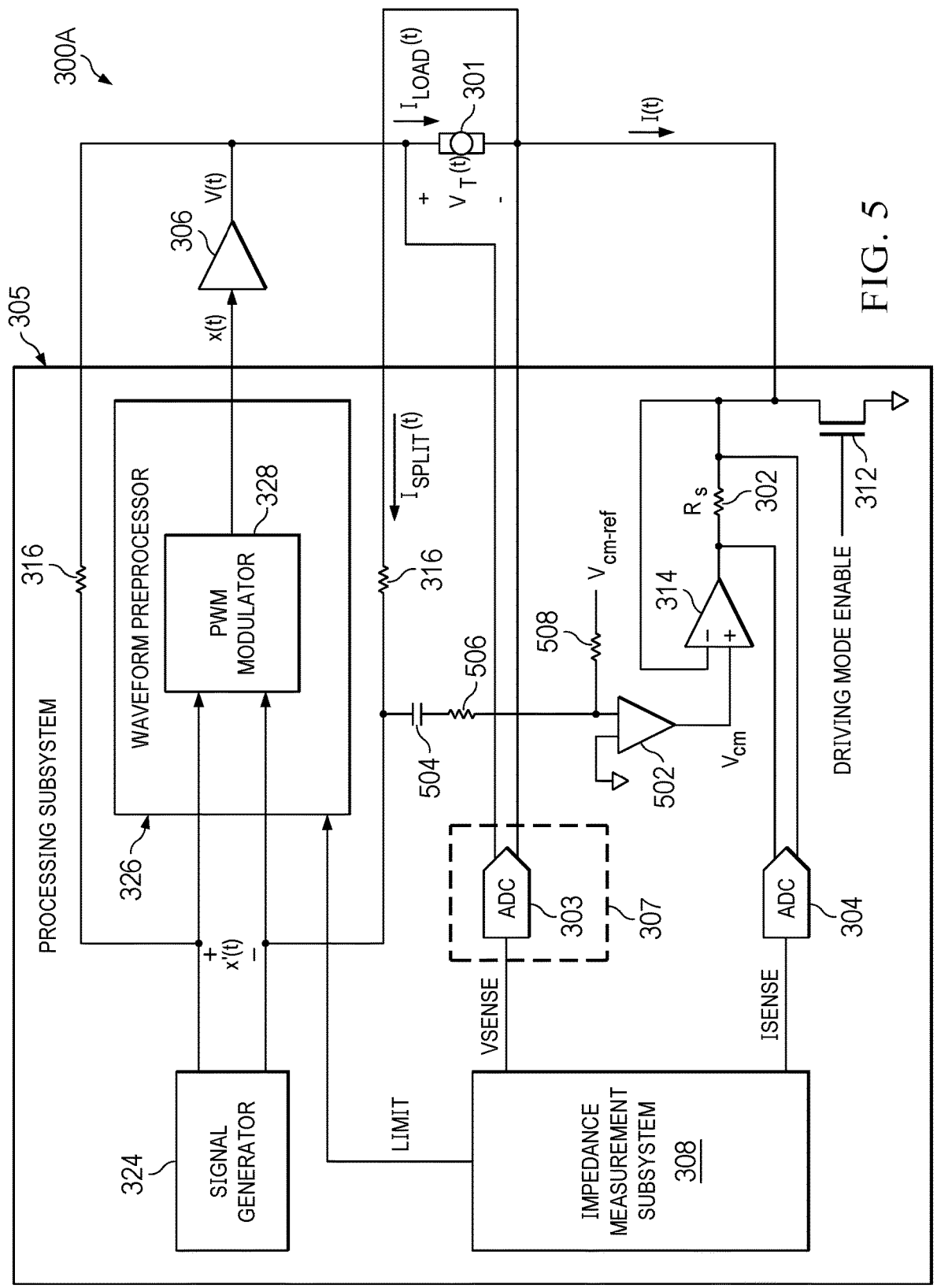
FIG. 5 illustrates selected components of an example host device including analog circuitry for compensating current splitting error, in accordance with embodiments of the present disclosure.

For example, FIG. 5 illustrates selected components of an example host device 300A including analog circuitry for compensating current splitting error, in accordance with embodiments of the present disclosure. Host device 300A depicted in FIG. 5 may be similar in many respects to host device 300 depicted in FIG. 3. Accordingly, only differences between host device 300 and host device 300A may be described below.

In the architecture shown in FIG. 3, common-mode voltage $V_{CM}$ is shown as being maintained at a constant direct-current voltage. However, the alternating current of split current $I_{SPLIT}$(t) flowing into the feedback resistor 316 coupled to the negative terminal of electromagnetic load 301 may be a result of the variance of the electrical node (e.g., a summing node) of the input terminal of PWM modulator 328 coupled to such feedback resistor due to raw transducer driving signal x'(t) generated by signal generator 324.

To overcome this disadvantage, host device 300A may include a compensation circuit to compensate for such variance, wherein such compensation circuit may comprise a summing amplifier 502 with a first terminal coupled to ground voltage and a coupling capacitor 504 coupled between the summing node and a resistor divider comprising resistors 506 and 508, wherein the electrical node common to resistors 506 and 508 may be coupled to the second terminal of summing amplifier 502. This compensation circuit may vary common-mode voltage $V_{CM}$ itself by an amount equal to the alternating current variation of the summing node, effectively minimizing or eliminating alternating current voltage across the feedback resistor 316, thus effectively minimizing or eliminating measurement error due to split current $I_{SPLIT}$(t). While FIG. 5 depicts a particular example compensation circuit for performing such compensation, any other suitable approach that varies common-mode voltage $V_{CM}$ as a function of the voltage present on the summing node may be used.

Figure 6:
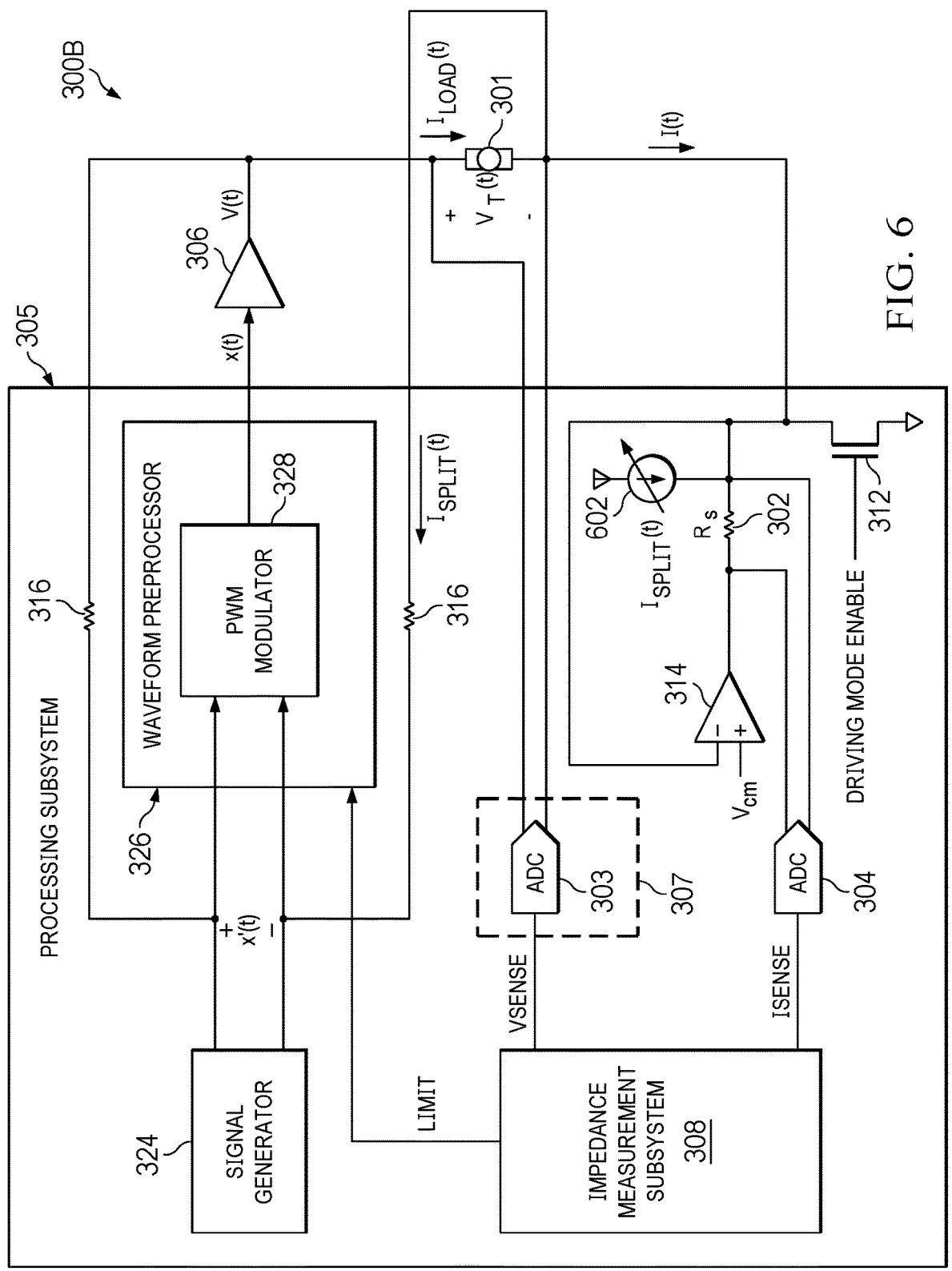
FIG. 6 illustrates selected components of another example host device including analog circuitry for compensating current splitting error, in accordance with embodiments of the present disclosure.

FIG. 6 illustrates selected components of an example host device 300B including analog circuitry for compensating current splitting error, in accordance with embodiments of the present disclosure. Host device 300B depicted in FIG. 6 may be similar in many respects to host device 300 depicted in FIG. 3. Accordingly, only differences between host device 300 and host device 300B may be described below.

As shown in FIG. 6, if split current $I_{SPLIT}$(t) can be estimated, a variable current source 602 may be used to drive a current approximately equivalent to split current $I_{SPLIT}$(t) into the common-mode voltage node present at the negative terminal of electromagnetic load 301, such that this approximated split current $I_{SPLIT}$(t) is combined with current I(t) to generate the current flowing across shunt resistor 302. The current generated by current source 602 may be estimated, calculated, and/or generated based on equation (1) set forth above. Thus, in some embodiments, the current generated by current source 602 may be a function of the voltage present on the negative input terminal of PWM modulator 328.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
amplifier circuitry configured to drive an electromagnetic load with a driving signal; and
a processing system communicatively coupled to the electromagnetic load and configured to:
compensate for current-sensing error of the processing system caused by feedback circuitry of the amplifier circuitry; and
operate in a plurality of modes including:
a driving mode in which the amplifier circuitry generates a human-perceptible driving signal to the electromagnetic load; and
a load sensing mode of the system for sensing a physical quantity associated with the electromagnetic load in which the amplifier circuitry generates a pilot signal to the electromagnetic load and the physical quantity is based on a measured characteristic of the electromagnetic load in response to the pilot signal;
wherein the processing system is further configured to:
during the driving mode, couple a first terminal of the electromagnetic load to a ground voltage; and
during the load sensing mode:
couple the first terminal to a current-sensing circuit having a sense resistor coupled between the first terminal and an electrical node driven to a common-mode voltage; and
sense the physical quantity based on a voltage across the sense resistor.

2. The system of claim 1, wherein the processing system is further configured to:
determine the current-sensing error at an electrical node of the system; and
modify the common-mode voltage as a function of the current-sensing error.

3. A system comprising:
amplifier circuitry configured to drive an electromagnetic load with a driving signal; and
a processing system communicatively coupled to the electromagnetic load and configured to:
compensate for current-sensing error of the processing system caused by feedback circuitry of the amplifier circuitry;
operate in a plurality of modes including:
a driving mode in which the amplifier circuitry generates a human-perceptible driving signal to the electromagnetic load; and
a load sensing mode of the system for sensing a physical quantity associated with the electromagnetic load in which the amplifier circuitry generates a pilot signal to the electromagnetic load and the physical quantity is based on a measured characteristic of the electromagnetic load in response to the pilot signal; and
compensate for current-sensing error of the processing system caused by feedback circuitry of the amplifier circuitry during the load sensing mode.

4. The system of claim 3, wherein the processing system is further configured to:
determine the current-sensing error; and
supply a current corresponding to the current-sensing error to current-sensing circuitry of the processing system.

5. A system of claim 1, comprising:
amplifier circuitry configured to drive an electromagnetic load with a driving signal; and
a processing system communicatively coupled to the electromagnetic load and configured to:
compensate for current-sensing error of the processing system caused by feedback circuitry of the amplifier circuitry;
estimate a split current flowing in the feedback circuitry based on a monitored voltage; and
apply a compensation based on the split current to a measured current associated with the electromagnetic load to estimate a load current flowing through the electromagnetic load.

6. The system of claim 5, wherein the physical quantity is a complex impedance of the electromagnetic load and the processing system and further configured to estimate the complex impedance based on the monitored voltage and a combination of the measured current and the compensation.

7. The system of claim 6, wherein the processing system is further configured to:
apply the compensation to the measured current in the time domain to generate the combination;
transform the monitored voltage from the time domain to a frequency-domain voltage vector;
transform the combination from the time domain to a frequency-domain current vector; and
estimate the complex impedance based on the frequency-domain voltage vector and the frequency-domain current vector.

8. The system of claim 6, wherein the processing system is further configured to:
transform the monitored voltage from the time domain to a frequency-domain voltage vector;
transform the measured current from the time domain to a frequency-domain current vector;
apply the compensation to the frequency-domain current vector in the frequency domain to generate the combination; and
estimate the complex impedance based on the frequency-domain voltage vector and the combination.

9. A method comprising:
driving, with amplifier circuitry, an electromagnetic load with a driving signal;
compensating for current-sensing error of a processing system communicatively coupled to the electromagnetic load, wherein the current-sensing error is caused by feedback circuitry of the amplifier circuitry;
operating the processing system in a plurality of modes including:
a driving mode in which the amplifier circuitry generates a human-perceptible driving signal to the electromagnetic load; and
a load sensing mode of the system for sensing a physical quantity associated with the electromagnetic load in which the amplifier circuitry generates a pilot signal to the electromagnetic load and the physical quantity is based on a measured characteristic of the electromagnetic load in response to the pilot signal;
during the driving mode, coupling a first terminal of the electromagnetic load to a ground voltage; and
during the load sensing mode:
coupling the first terminal to a current-sensing circuit having a sense resistor coupled between the first terminal and an electrical node driven to a common-mode voltage; and
sensing the physical quantity based on a voltage across the sense resistor.

10. The method of claim 9, further comprising:
determining the current-sensing error at an electrical node of the system; and
modifying the common-mode voltage as a function of the current-sensing error.

11. A method comprising:
driving, with amplifier circuitry, an electromagnetic load with a driving signal;
compensating for current-sensing error of a processing system communicatively coupled to the electromagnetic load, wherein the current-sensing error is caused by feedback circuitry of the amplifier circuitry;
operating the processing system in a plurality of modes including:
a driving mode in which the amplifier circuitry generates a human-perceptible driving signal to the electromagnetic load; and
a load sensing mode of the system for sensing a physical quantity associated with the electromagnetic load in which the amplifier circuitry generates a pilot signal to the electromagnetic load and the physical quantity is based on a measured characteristic of the electromagnetic load in response to the pilot signal; and
compensating for current-sensing error of the processing system caused by feedback circuitry of the amplifier circuitry during the load sensing mode.

12. The method of claim 11, further comprising:
determining the current-sensing error; and
supplying a current corresponding to the current-sensing error to current-sensing circuitry of the processing system.

13. A method comprising:
driving, with amplifier circuitry, an electromagnetic load with a driving signal;
compensating for current-sensing error of a processing system communicatively coupled to the electromagnetic load, wherein the current-sensing error is caused by feedback circuitry of the amplifier circuitry;
estimating a split current flowing in the feedback circuitry based on a monitored voltage; and
applying a compensation based on the split current to a measured current associated with the electromagnetic load to estimate a load current flowing through the electromagnetic load.

14. The method of claim 13, wherein the physical quantity is a complex impedance of the electromagnetic load and the method further comprises estimating the complex impedance based on the monitored voltage and a combination of the measured current and the compensation.

15. The method of claim 14, further comprising:
applying the compensation to the measured current in the time domain to generate the combination;
transforming the monitored voltage from the time domain to a frequency-domain voltage vector;
transforming the combination from the time domain to a frequency-domain current vector; and
estimating the complex impedance based on the frequency-domain voltage vector and the frequency-domain current vector.

16. The method of claim 14, further comprising:
transforming the monitored voltage from the time domain to a frequency-domain voltage vector;
transforming the measured current from the time domain to a frequency-domain current vector;
applying the compensation to the frequency-domain current vector in the frequency domain to generate the combination; and
estimating the complex impedance based on the frequency-domain voltage vector and the combination.

* * * * *